(12) United States Patent
Kim et al.

(10) Patent No.: US 7,115,843 B2
(45) Date of Patent: Oct. 3, 2006

(54) HIGH-FREQUENCY PULSE OSCILLATOR

(75) Inventors: Stanislav K Kim, Zhukovsky (RU); Eduard I Anisimov, Zhukovsky (RU); Alexandre S. Drojjine, Zhukovsky (RU); Vladimir A. Martynov, Zhukovsky (RU); Won-Guk Jee, Incheon (KR)

(73) Assignee: Kyong In Special Metal Co., Ltd., Incheon (KR)

( * ) Notice: Subject to any disclaimer, the term of this patent is extended or adjusted under 35 U.S.C. 154(b) by 0 days.

(21) Appl. No.: 11/041,221

(22) Filed: Jan. 25, 2005

(65) Prior Publication Data

US 2006/0050536 A1    Mar. 9, 2006

(30) Foreign Application Priority Data

Sep. 7, 2004    (KR) .................... 10-2004-0071067

(51) Int. Cl.
*H05B 1/02* (2006.01)
(52) U.S. Cl. .................. 219/501; 219/497; 219/508; 219/665
(58) Field of Classification Search ............. 219/497, 219/494, 501, 505, 492, 673, 653, 675, 665, 219/508
See application file for complete search history.

(56) References Cited

U.S. PATENT DOCUMENTS

| | | | |
|---|---|---|---|
| 4,501,947 A | * | 2/1985 | Kerlin ..................... 219/68 |
| 5,363,020 A | * | 11/1994 | Chen et al. ............. 315/209 R |
| 5,990,465 A | * | 11/1999 | Nakaoka et al. .......... 219/629 |

FOREIGN PATENT DOCUMENTS

| | | |
|---|---|---|
| JP | 62-139289 | 6/1987 |
| JP | 10-180317 | 7/1998 |
| JP | 11-097771 | 4/1999 |
| JP | 2000-171399 | 6/2000 |
| JP | 2004-014487 | 1/2004 |
| WO | 2004-004420 | 1/2004 |

OTHER PUBLICATIONS

Japanese Office Action dated Apr. 14, 2006.

* cited by examiner

*Primary Examiner*—Mark Paschall

(57) ABSTRACT

The present invention generally relates to a high-frequency pulse oscillator, and more particularly to a high-frequency pulse oscillator adapted to provide pulse currents having a high frequency and large amplitude so as to transition metallic materials into a plastic state for ease of processing or for closing microcracks formed in metallic parts in order to recover mechanical characteristics thereof. The high-frequency pulse oscillator of the present invention comprises a controllable rectifier, a switching section, and a control system. The controllable rectifier rectifies alternating currents supplied from a current source to output currents having a predetermined waveform, according to a control signal from the control system. The switching section generates pulse currents using the currents from the rectifier, according to another control signal from the control system. The switching section comprises at least one switching block, which is connected so that the amplitude of the pulse currents is increased. The control system controls the rectifier and the switching section according to the signals to start, stop, and reset the operation of generating the pulse currents and the signals to specify or change the frequency and amplitude of the pulse currents, so that the generated pulse currents may have desired frequency and amplitude. The pulse currents generated in the high-frequency pulse oscillator enable the manufacture of various structural parts without degrading their structure.

10 Claims, 6 Drawing Sheets

HIGH-FREQUENCY PULSE OSCILLATOR

FIELD OF THE INVENTION

The present invention generally relates to a high-frequency pulse oscillator, and more particularly to a high-frequency pulse oscillator adapted to provide pulse currents having a high frequency and large amplitude so as to transition metallic materials into a plastic state for ease of processing or for closing microcracks formed in metallic parts in order to recover mechanical characteristics thereof.

BACKGROUND OF THE INVENTION

Metal works (rolling process in particular), in which a high-frequency pulse oscillator of the present invention may be employed, will be discussed below. Rolling refers to a process that induces plastic deformation of metallic materials by compressing and squeezing the materials between work rolls. Rolling is a type of plastic processing wherein production speed is high and dimensional accuracy can be easily controlled. Since rolling requires relatively lower production costs and provides products having more uniform dimensional accuracy and quality than molding or casting, it is most frequently used. In a rolling process, materials to be processed receive compressive stress caused by the pressing force of the rolls while they pass through the rolls, and further undergo shear stress on the interfaces with the rolls. The shear stress acts to thrust the materials between the rolls.

There are essentially two types of rolling process, i.e., hot rolling and cold rolling. Cold rolling refers to rolling the materials to be processed, such as ingots, at a normal temperature and is used for providing products such as sheets, strips and foils, which have high strength and good dimensional accuracy. On the other hand, hot rolling refers to rolling metallic materials after applying heat with a heating furnace. Generally, through hot rolling, ingots are processed into blooms or billets and are further processed into boards, sheets, bars, pipes and rails.

Since cold rolling is performed at a normal temperature, it is advantageous in that there is no need for any special equipments for heating materials such as strips. However, cold rolling typically requires an annealing process. As such, the entire rolling process time becomes lengthened while the productivity is lowered.

In hot rolling, a metal strip is heated in a heating furnace and is then fed to a rolling device. It is extremely important to heat the metal strip to a specified temperature before rolling. That is, if the heating temperature is much lower than the specified temperature, then various problems may occur (e.g., difficulty in carrying out rolling, excessive loads are imposed on the rolling device, and desirable properties cannot be obtained for the rolled strip). However, if an excessively high temperature is set as the heating temperature (considering that temperature decreases during the transfer of the heated metal strip to the rolling device), then there is an increase in the oxidization of the metal strip. Thus, the resulting energy costs inevitably increase and may even become burdensome. Under these circumstances, it is advisable in hot rolling to heat the metal strips as closely as possible to the work rolls. For such purpose, it is plausible to employ a high-frequency induction heating method and an electric heating method.

However, a high-frequency induction heating device is usually complicated, expensive and consumes too much power.

On the other hand, in the electric heating method, the work rolls and the metal strip are heated by their respective electrical resistance when direct currents from a power source are applied to the upper/lower work rolls and the strip. Thus, their temperatures tend to rise. An example of an electric heating type rolling device is disclosed in Japanese Patent Publication No. 1998-180317. However, the prior art electric heating type rolling device consumes too much power. For instance, when a steel strip having a width of 100 mm and a thickness of 2 mm (i.e., a cross-sectional area of 2 $cm^2$) is rolled to have a thickness of 0.25~0.3 mm by electric-heating, a current density of about 104 $A/cm^2$ is required. If a direct current is applied, then the current strength reaches 20 kA, which is a multiplication between the current density and the cross-sectional area of the strip to be rolled. In addition to such excessive power-consumption, the steel strip is heated to a temperature ranging from 400° C. to 500° C., which causes oxidization and discoloration on the strip surface. Further, since the work rolls are included in the electric circuit, the life of work rolls may be shortened due to electric corrosion. Also, a cooling device, which prevents the work rolls from being damaged due to heat transfer from the steel strip, is additionally required. Moreover, adverse effects upon the environment may occur around the production premises.

SUMMARY OF THE INVENTION

The present invention generally relates to a high-frequency pulse oscillator, and more particularly to a high-frequency pulse oscillator adapted to provide pulse currents having a high frequency and large amplitude so as to transition metallic materials into a plastic state for ease of processing or for closing microcracks formed in metallic parts in order to recover mechanical characteristics thereof.

The high-frequency pulse oscillator of the present invention comprises: a controllable rectifier for rectifying alternating currents supplied from a current source to output currents having a predetermined waveform; a switching section comprising one or more switching blocks and generating pulse currents having desired amplitude and frequency from said currents having the predetermined waveform, wherein said one or more switching blocks are connected so that the amplitude of said pulse currents is increased; and a control system for generating first and second control pulses, wherein said first control pulse is supplied to said controllable rectifier to control rectifying said alternating currents and said second control pulse is supplied to said one or more switching blocks to control said currents having the predetermined waveform to be transformed into said pulse currents having the desired amplitude and frequency.

The control system may comprise: a pulse-phase control system for generating said first control pulse; a voltage-controlled oscillator (VCO) for generating said second control pulse; a protection/automation unit for controlling said pulse-phase control system and said voltage-controlled oscillator according to START, STOP, and RESET signals to start, stop, and reset the operation of generating said pulse currents; and a power supply/synchronization unit for providing a stable voltage source using said alternating currents supplied from said current source and generating signals to synchronize said pulse-phase control system.

When receiving said START signal, said protection/automation unit may generate SWITCH-ON signal for said voltage-controlled oscillator and instruct said pulse-phase control system to release blocking of said first control pulse.

When receiving said STOP signal or realizing an excess of current limits of said high-frequency pulse oscillator, the protection/automation unit may stop supplying said SWITCH-ON signal to said voltage-controlled oscillator. It may then instruct said pulse-phase control system to block said first control pulse and invert said controllable rectifier. When receiving said RESET signal, said protection/automation unit may approve the generation of said SWITCH-ON signal only after confirming that said current limit is not exceeded and said current source is completely discharged.

The control system may further comprise a remote and local control panel for generating signals to start, stop, and reset the operation of generating said pulse currents and signals to specify or change the frequency and amplitude of said pulse current. The control system may also comprise a selector for selectively receiving said signals from either said remote or local control panel according to LOCAL/REMOTE signal from said local control panel.

The controllable rectifier may be a controllable three-phase rectifier comprising a thyristor. In this case, said first control pulse may be applied to a control electrode of said thyristor.

The switching section may comprise: a current sensor for measuring currents in the load to which said pulse currents are supplied; a pulse transformer for causing said pulse currents to have the desired amplitude; and a switching thyristor for causing said pulse currents to have the desired frequency. In this case, said control system may receive the measurements of the currents in said load from said current sensor.

In case the above high-frequency oscillator is employed in a rolling mill, whereas continuous direct currents are applied to the upper/lower work rolls and metallic materials in the prior arts, the high-frequency pulse oscillator provides discrete pulse currents to prevent the temperature of the materials from being excessively increased due to continuous supply of energy. Further, since the upper/lower work rolls need not be included in electric circuits and the pulse currents are directly supplied to the materials using separate contact terminals (e.g., formed from a bunch of copper wires) for the load, the life of work rolls is not shortened and the corrosion resistance of work rolls is not reduced.

BRIEF DESCRIPTION OF DRAWINGS

The above features of the present invention will become more apparent from the following description of the preferred embodiments given in conjunction with the accompanying drawings.

DETAILED DESCRIPTION OF THE INVENTION

It will be readily understood that the components of the present invention, as generally described and illustrated in the Figures herein and accompanying text, could be arranged and designed in a wide variety of different configurations while still utilizing the present inventive concept. Thus, the following detailed description of the preferred embodiments of the high-frequency pulse oscillator of the present invention, as represented in FIGS. 1 through 6 and accompanying text, is not intended to limit the scope of the invention, as claimed, but it is merely representative of the presently preferred embodiments of the invention. The presently preferred embodiments of the invention will be best understood by reference to the drawings, wherein like parts or steps are designated by like numerals throughout.

Figure 1:
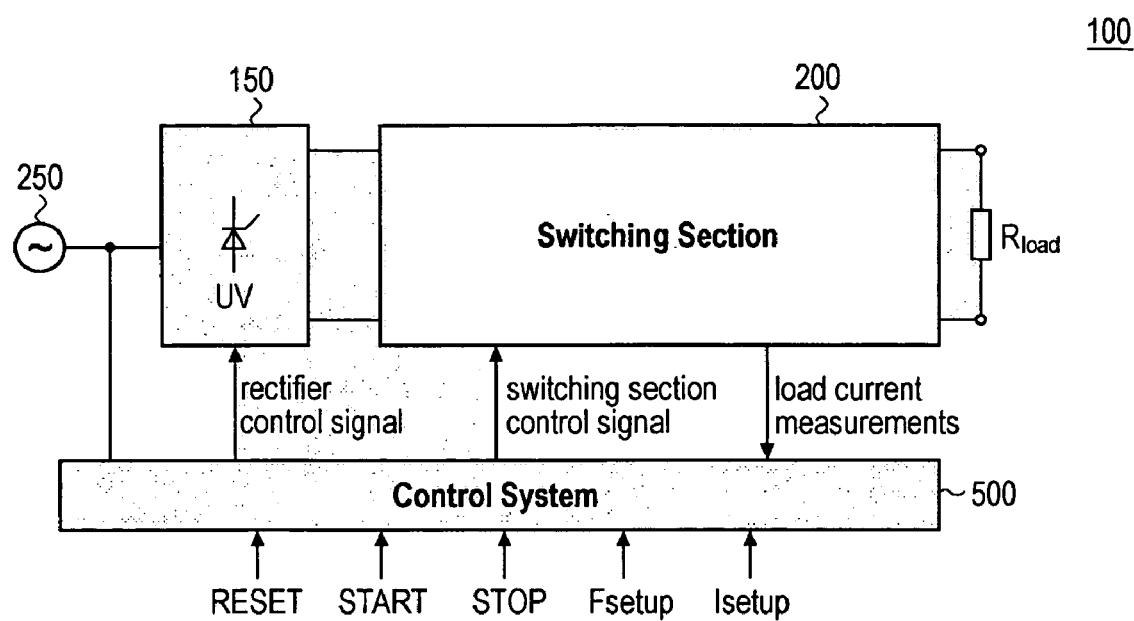
FIG. 1 is a schematic diagram illustrating basic components and their connections in the high-frequency pulse oscillator constructed in accordance with the present invention.

FIG. 1 is a schematic diagram illustrating the basic components and their connections in the high-frequency pulse oscillator constructed in accordance with the present invention.

As shown in FIG. 1, the high-frequency pulse oscillator 100 comprises: a control system 500 for processing instructions to start, stop and reset the operation of generating pulse currents and controlling adjustments to the amplitude and frequency of the generated pulse currents; a controllable rectifier 150 for rectifying alternating currents supplied from a current source 250, which is in accordance with a control signal from the control system 500, to output currents having a predetermined waveform; and a switching section for generating pulse currents having desired amplitude and frequency from the currents outputted from the rectifier 150. The generated pulse currents are supplied to a load $R_{load}$. The control system 500 and the switching section 200 are connected to a common current source 250, which preferably provides alternating currents having an amplitude of 380–690 V and a frequency of 50–60 Hz.

The control system 500 may be connected to a control electrode and an anode of a switching thyristor, which is included in the switching section 200, to provide a control signal for controlling the switching thyristor. Also, the control system 500 receives measurements of the currents in the load $R_{load}$, which is connected to the switching section 200, to control the operations of the high-frequency pulse oscillator 100 according to the measurements. The control system 500 generates START, STOP, and RESET signals to start, stop, and reset the operation of generating the pulse currents, respectively. It also generates $F_{setup}$ and $I_{setup}$ signals to indicate the desired frequency and amplitude of the generated pulse currents based on the instructions that a user issues through a remote or local control panel. In accordance with those signals, the control system 500 initiates or discontinues the generation of pulse currents and controls the switching section 200 and the rectifier 150 so that the pulse currents supplied to the load $R_{load}$ may have the desired amplitude and frequency. The specific constitution of the control system 500 will be described below in view of FIG. 5.

The controllable rectifier 150 may be a three-phase rectifier comprising a thyristor UV. In this case, the control system 500 may be connected to a control electrode of the thyristor UV to provide a control signal (a first control pulse) for controlling the thyristor UV.

The switching section 200 generates pulse currents having desired amplitude and frequency from the currents outputted from the controllable rectifier 150, which is in accordance with a control signal (a second control pulse) from the control system 500, and provides the generated pulse currents to the load $R_{load}$. An example of its specific constitution is illustrated in FIG. 2, along with the rectifier 150 and the control system 500.

Figure 2:
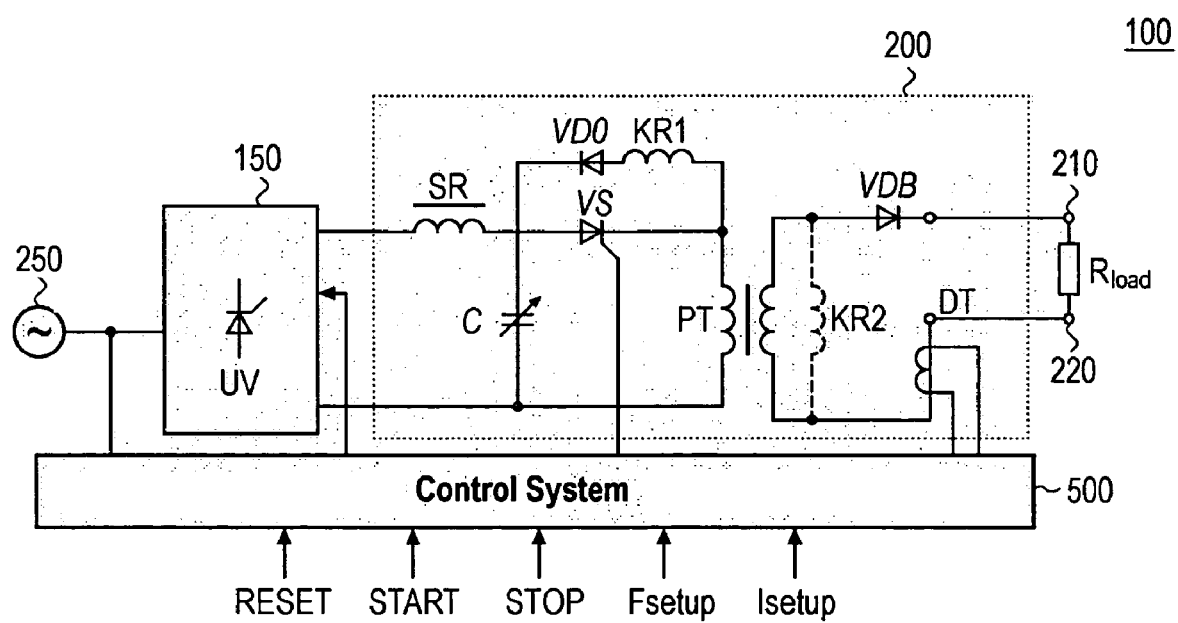
FIG. 2 depicts an embodiment of a switching section of the high-frequency pulse oscillator constructed in accordance with the present invention.

As shown in FIG. 2, the switching section 200 comprises: a current sensor DT for measuring the currents in the load $R_{load}$; a pulse transformer PT for causing the pulse currents supplied to the load $R_{load}$ to have the desired amplitude; and a switching thyristor VS for adjusting the frequency of the pulse currents based on the control signal from the control system 500. The switching section 200 further comprises: a capacitor C for charging and discharging currents during the operation of generating the pulse currents; a smoothing reactor SR for limiting the currents charging the capacitor C; a discharging diode VD0 for rectifying the currents discharged from the capacitor C through the pulse transformer PT before supplying the currents to the load $R_{load}$; and a first switching reactor KR1 and an output diode VDB, which are connected in parallel with the switching thyristor VS, for causing the switching thyristor VS to have an inverse voltage after the capacitor C is discharged. The switching section 200 is connected to the load $R_{load}$ through first and second output contacts, each of which may be formed from a bunch of copper wires.

Referring to FIG. 2, the specific connections between the components of the switching section 200 are described below. As for the pulse transformer PT, a first input on the upper end of a primary winding, which is on the left side of the pulse transformer, is connected to the first switching reactor KR1 and the switching thyristor VS. Further, a second input on the lower end of the primary winding is connected to a lower (second) pole of the capacitor C and a lower (second) output terminal of the rectifier 150. A first output on the upper end of a secondary winding, which is on the right side of the pulse transformer PT, is connected via the output diode VDB to the first output contact 210. Also, a second output on the lower end of the secondary winding is connected via a primary winding of the current sensor DT to the second output contact 220.

The connection between the rectifier 150 and the switching section 200 is now described below. An upper (first) output terminal of the controllable rectifier 150 is connected via the smoothing reactor SR to a upper (first) pole of the capacitor C and also to opposing inputs of the switching thyristor VS and the discharging diode VD0 (an output of the discharging diode VD0 is connected to the first switching reactor KR1). The second output terminal is connected to the second pole of the capacitor C and the second input of the primary winding of the pulse transformer PT.

Meanwhile, if the working current is low or the load resistance is large (e.g., the resistance may be very large when the load is disconnected), the switching section 200 may further comprise a second switching reactor KR2 such as a choke coil. The second switching reactor KR2 is connected in parallel with the outputs of the secondary winding of the pulse transformer PT. The currents in the load $R_{load}$ are measured using the current sensor DT.

Although the switching section 200 described above comprises a single block (i.e., switching block), the switching section may comprise a plurality of switching blocks. In this case, the currents are charged and discharged through a plurality of capacitors (i.e., capacitor bank) and the amount of the charged currents increases. Also, the number of the pulse transformers through which the current are discharged is increased. Therefore, the maximum amplitude of the pulse currents, which are generated from the high-frequency pulse oscillator 100, may be increased. In this constitution, the plurality of switching blocks may be connected in parallel or in series. Examples where n blocks are connected in parallel or in series are illustrated in FIGS. 3 and 4, respectively.

Figure 3:
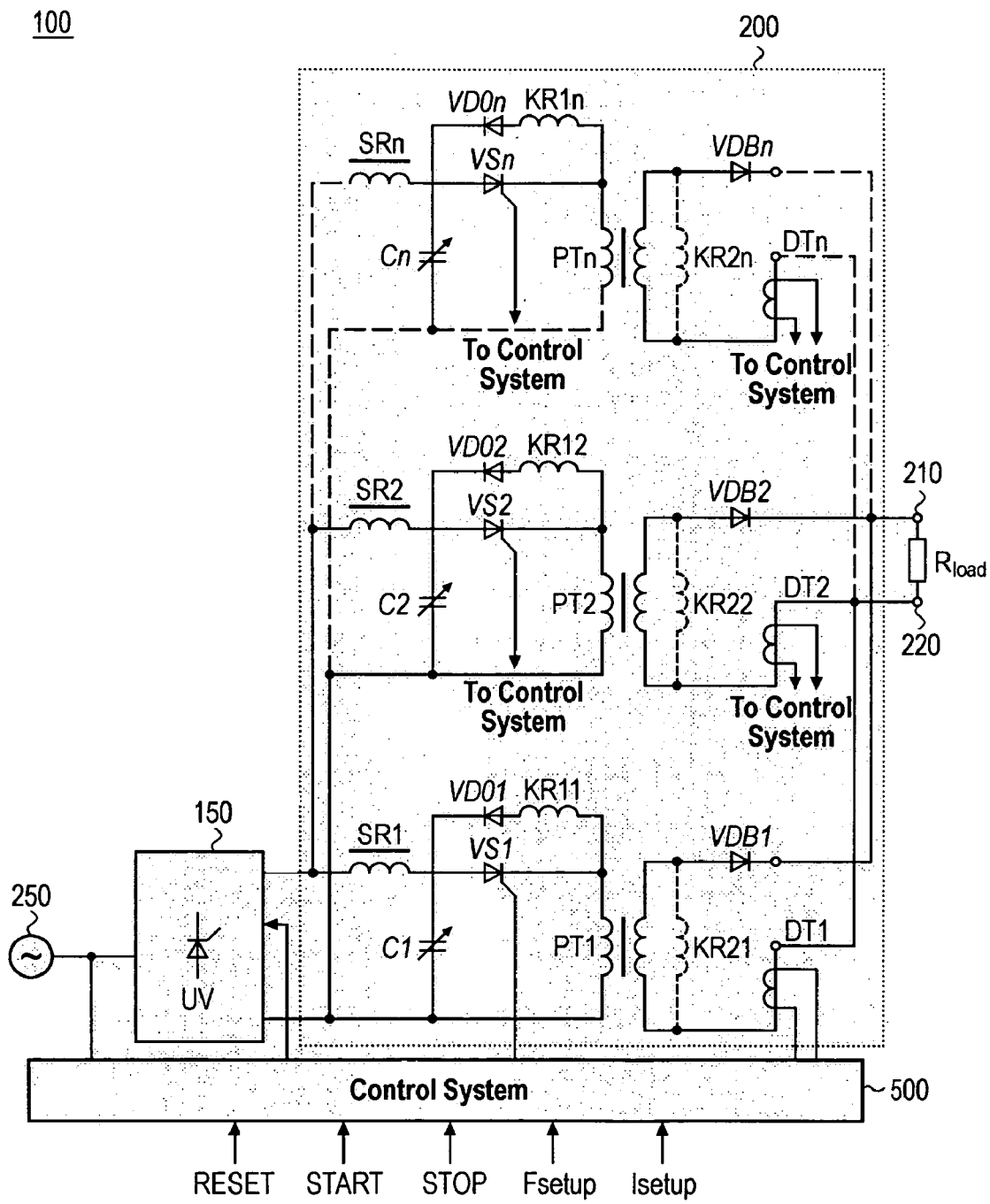
FIG. 3 depicts an embodiment of a switching section in which the switching blocks in FIG. 2 are connected in parallel in accordance with the present invention.

Referring to FIG. 3, the switching blocks, which have the same configuration as the one shown in FIG. 2, are connected n times in parallel. The first and second output terminals of the rectifier 150 are connected in parallel with the inputs on the left ends of the smoothing reactors (SR1–SRn) and the second poles on the lower ends of the capacitors (C1–Cn) in the switching blocks, respectively. The output terminals on the right ends of the output diodes (VDB1–VDBn) and the output terminals of the primary windings of the current sensors (DT1–DTn) in the switching blocks are connected in parallel with the first and second output contacts 210, 220, respectively.

Figure 4:
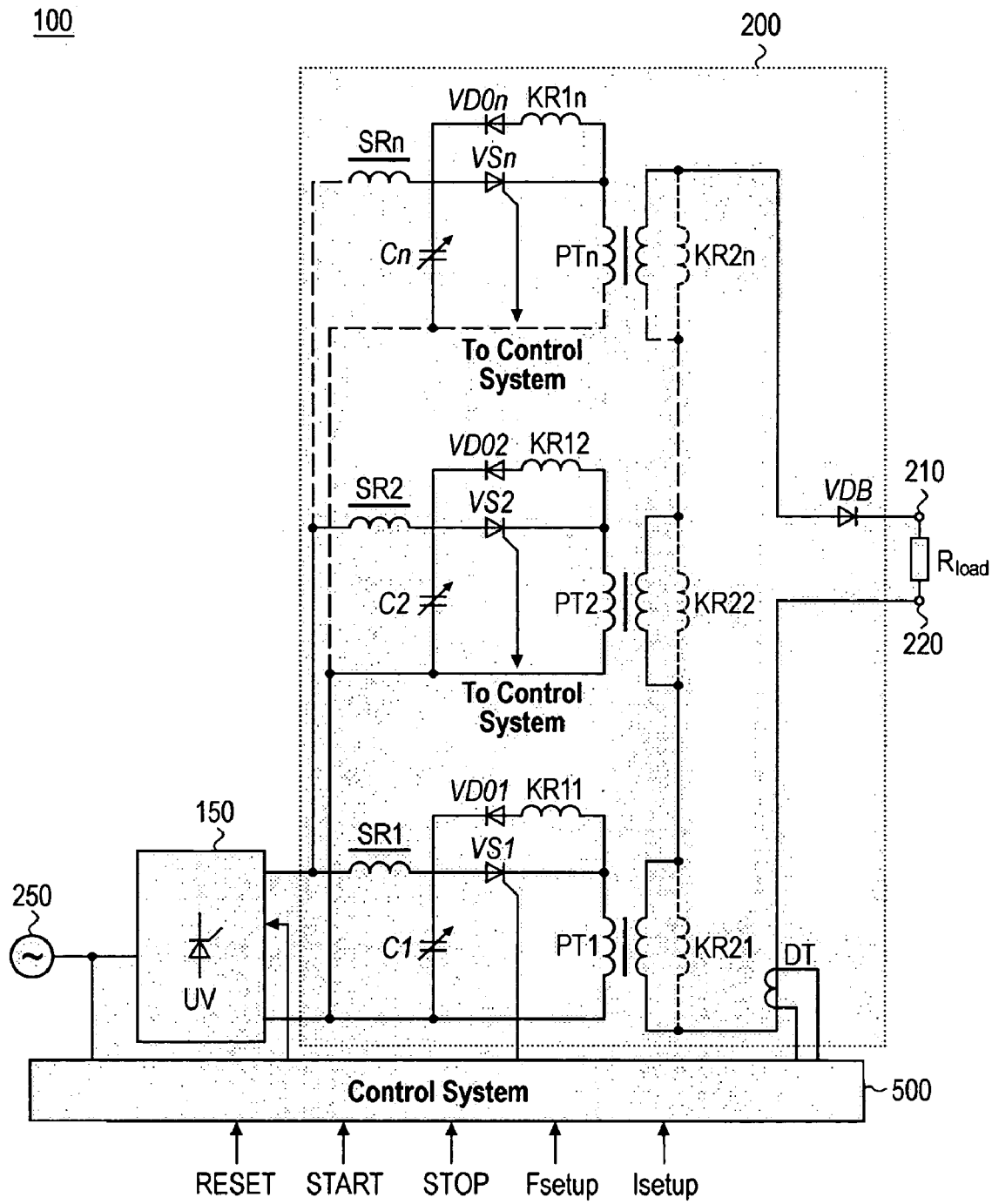
FIG. 4 depicts an embodiment of a switching section in which the switching blocks in FIG. 2 are connected in series in accordance with the present invention.

FIG. 4 illustrates a switching section 200 wherein n switching blocks are connected in series. That is, a first output terminal of a secondary winding of the pulse transformer PTn in the $n^{th}$ switching block is connected via the output diode VDB to the first output contact 210. Further, a second output terminal of a secondary winding of the pulse transformer PT1 in the first switching block is connected via the primary winding of the current sensor DT to the second output contact 220. First output terminals of secondary windings of the pulse transformers PT1–PTn−1 in the $1^{st}$ to the n−$1^{th}$ switching blocks are connected to second output terminals of secondary windings of the pulse transformers PT2–PTn in the $2^{nd}$ to the $n^{th}$ switching blocks, respectively.

As discussed above, through serial or parallel connections (or the combination of the two), the maximum amplitude of the pulse currents supplied to the load $R_{load}$ may be increased. Instead of using a single rectifier, each of the switching blocks may be equipped with an individual controllable rectifier, if necessary.

Figure 5:
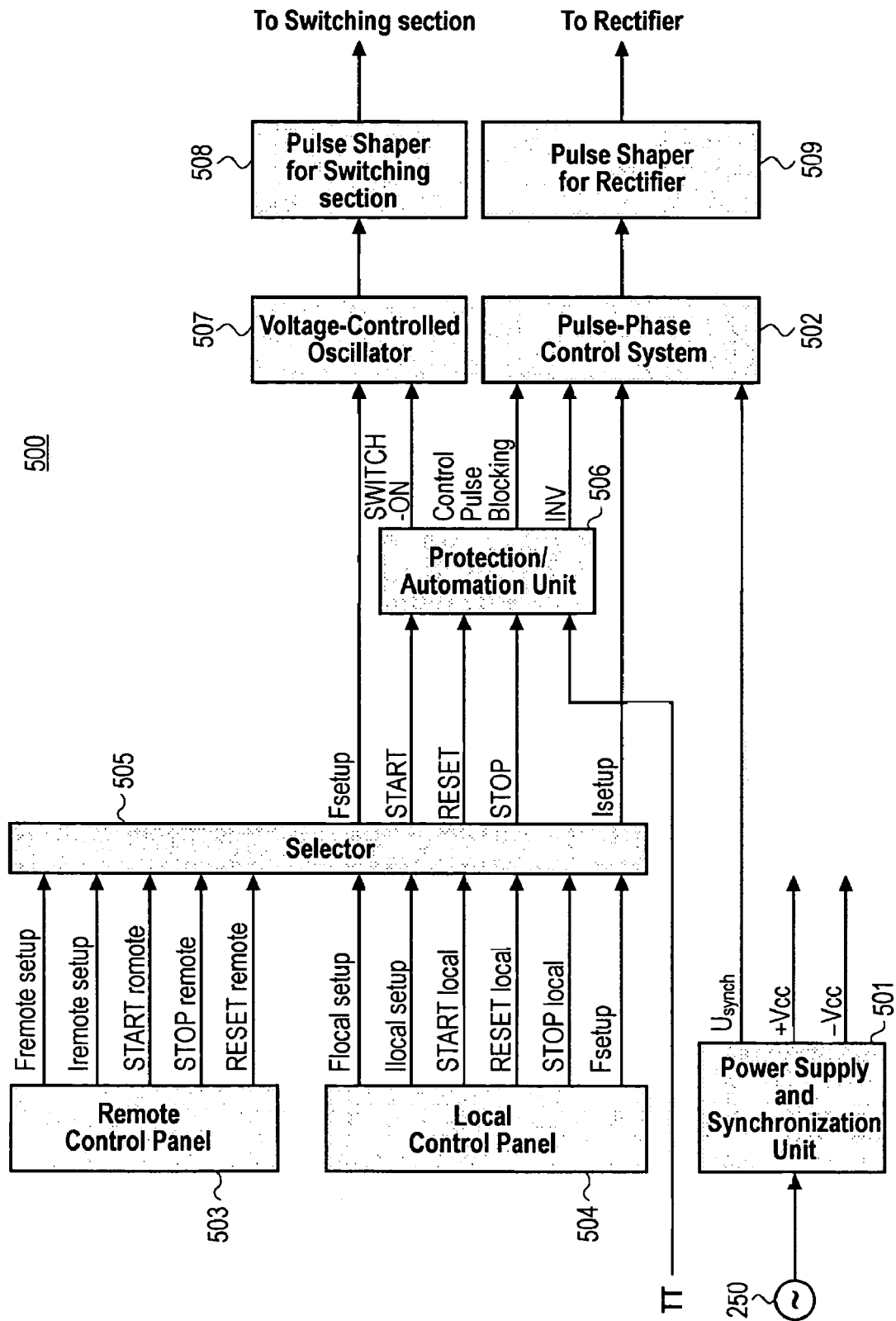
FIG. 5 depicts a block diagram illustrating the control system of the high-frequency pulse oscillator constructed in accordance with the present invention.
Figure 6:
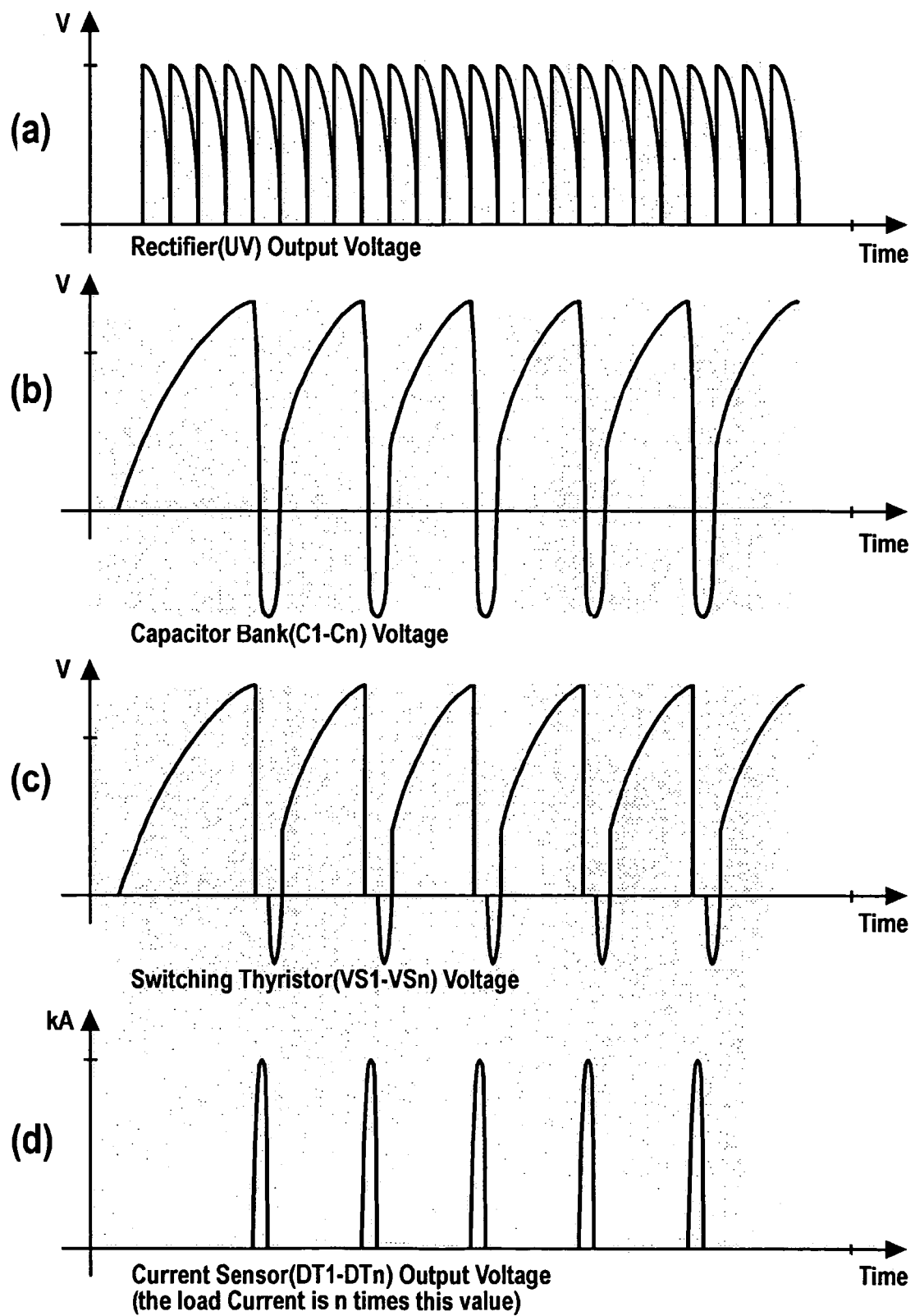
FIG. 6 depicts plots illustrating waveforms from the components of the high-frequency oscillator constructed in accordance with the present invention.

Referring now to FIG. 5, the constitution of the control system 500, which is mentioned above, is more specifically described below.

FIG. 5 depicts a block diagram illustrating the control system 500 of the high-frequency pulse oscillator, which is connected to the switching section 200 as shown in FIGS. 1–4. The control system 500 comprises: a power supply/synchronization unit for providing a stable voltage source to all components of the control system 500 and generating a signal $U_{synch}$ to synchronize the pulse-phase control system 502; a pulse-phase control system for generating a signal (a first control pulse) for controlling the rectifier 150 to set up and stabilize the parameters of the generated pulse currents as desired; remote and local control panels 503, 504 for generating START, STOP, RESET, $F_{setup}$ and $I_{setup}$ signals to control the operation of generating the pulse currents and to specify the frequency and amplitude of the pulse currents; a selector 505 for selectively receiving those signals from either said remote or local control panel according to LOCAL/REMOTE signal from the local control panel 503; a protection/automation unit 506 for controlling the pulse-phase control system 502 and the voltage-controlled oscillator 507 according to the signals from the selector 505; a voltage-controlled oscillator (VCO) 507 for generating a signal (a second control pulse) for controlling the switching thyristors (VS1–VSn) included in the switching section 200; and pulse shapers 508, 509 for shaping the first and second control pulses, respectively.

The power supply/synchronization unit 501 energizes all components of the control system 500 with a stable voltage source±Vcc (e.g., ±15 V) using the alternating currents applied thereto, which may be identical to the currents applied to the rectifier 150. It also provides a synchronization signal $U_{synch}$ to the pulse-phase control system 502 to synchronize the pulse-phase control system 502 with a clock signal.

The remote and local control panels 503, 504 generate signals (START, STOP and RESET) to start, stop and reset the operation of generating pulse currents supplied to the load $R_{load}$ and signals ($F_{setup}$ and $I_{setup}$) to specify the frequency and amplitude of the pulse currents. A user may input desired instructions using the input means of the remote or local control panel 503, 504, and then the signals corresponding to those instructions will be provided to the selector 505. That is, the remote control panel 503 generates $START_{remote}$, $STOP_{remote}$, $RESET_{remote}$, $F_{remotesetup}$ and $I_{remotesetup}$ signals, while the local control panel 504, which is mounted on the high-frequency pulse oscillator 100, generates $START_{local}$, $STOP_{local}$, $RESET_{local}$, $F_{localsetup}$, and $I_{localsetup}$ signals, according to the instructions from the user.

The selector 505 receives those signals from either the remote or local control panel 503, 504 according to LOCAL/REMOTE command that a user specifies through the local control panel 504. It further provides $F_{setup}$ signal to the voltage-controlled oscillator 507, $I_{setup}$ signal to the pulse-phase control system 502, and START, STOP, and RESET signals to the protection/automation unit 506.

The protection/automation unit 506 provides SWITCH-ON signal to the voltage-controlled oscillator 507 according to the START signal. When the STOP signal is received or protective circuits realize that the maximum current limit, which the electric circuits of the high-frequency pulse oscillator 100 can endure, is exceeded, the protection/automation unit 506 switches off the voltage-controlled oscillator 507 and provides a signal to block the first control pulse and a signal (INV) to invert the rectifier 150 to the pulse-phase control system 502. Meanwhile, the terminal timing (TT) signal is applied to the protection/automation unit 506 as a clock signal.

The voltage-controlled oscillator 507 generates the second control pulse for controlling the switching thyristors VS1–VSn, which are included in the switching section 200, on the basis of the $F_{setup}$ signal from the selector 505 and the SWITCH-ON signal from the protection/automation unit 506. The second control pulse is applied to the pulse shaper 508 for the switching section 200.

The pulse-phase control system 502 receives the signal for generating or blocking the first control pulse and the INV signal from the protection/automation unit 506, as well as the $I_{setup}$ signal from the selector 505. On the basis of those signals, it generates or blocks the first control pulse, which is supplied to the pulse shaper 509 for the rectifier 150.

An output terminal of the pulse shaper 508 is connected to the control electrodes and anodes of the switching thyristors VS1–VSn to provide the second control pulse for controlling the switching thyristors VS1–VSn. An output terminal of the pulse shaper 509 is connected to the control electrode of the thyristor UV, which is included in the rectifier 150, to provide the first control pulse for controlling the thyristor UV.

Referring now to FIGS. 3–5, the operations of the high-frequency pulse oscillator 100, which are in accordance with an embodiment of the present invention, are described below.

In order to generate the pulse currents to be supplied to the load $R_{load}$, alternating currents from the current source 250 are applied to the power supply/synchronization unit 501 and the rectifier 150. A user issues START command and specifies desired frequency and amplitude of the pulse currents using a remote or local control panel 503, 504 so that the selector 505 may generate START, $F_{setup}$, and $I_{setup}$ signals based on the signals from either one of the control panels. When the protection/automation unit receives the START signal, it orders the pulse-phase control system 502 to turn off the blocking of the first control pulse. Then, the first control pulse is transferred from the pulse shaper 509 to the rectifier 150. In accordance with the first control pulse, the rectifier 150 rectifies the alternating currents from the current source 250 to generate currents having a predetermined waveform (see FIG. 6(a)). When these currents are supplied to the switching section 200, the capacitors C1–Cn are charged to the voltage defined by the $I_{setup}$ signal. The currents for such charging operation are limited by the smoothing reactors SR1–SRn. After some time (e.g., ten to fifteen milliseconds) has passed since the START signal, the capacitors C1–Cn are initially charged to said voltage. Then, the SWITCH-ON signal from the protection/automation unit 502 initiates the generation of the second control pulse, which controls the switching thyristors VS1–VSn, in the voltage-controlled oscillator 507. When the second control pulse is supplied from the pulse shaper 508 to the switching section 200, the capacitors C1–Cn are discharged via the pulse transformers PT1–PTn, respectively. FIG. 6(b) shows the variations in the voltage of the capacitors C1–Cn while they are charged and discharged. The currents discharged from the capacitors C1–Cn are rectified by the discharging diodes VDB1–VDBn, which establishes the working cycle for the load $R_{load}$. When the capacitors C1–Cn are discharged, the energy accumulated in the pulse transformers PT1–PTn and connecting wires is utilized to open the inverse discharging diodes VD01–VD0n. Also, the switching thyristors VS1–VSn receive the inverse voltage that has an amplitude and duration depending on the parameters of the switching reactors KR11–KR1n (see FIG. 6(c)).

The duration of the pulse currents supplied to the load $R_{load}$ depends on the capacitance of the capacitors C1–Cn (e.g., from 80 to 200 μms). The amplitude of the pulse currents is varied (either smoothly or in increments) by using the switching blocks connected in parallel (FIG. 3), in series (FIG. 4), or in a combination (see FIG. 6(d)). The frequency and amplitude of the generated pulse currents may be monitored using additional displays on the remote and/or local control panels 503, 504 (during both the setup stage and the conventional operation) and corrected when necessary. The generated pulse currents are distributed amongst the switching section 200 in accordance with the resistance of the pulse transformers and the wires. If necessary, each switching block in the switching section 200 may be equipped with an individual controllable rectifier with a variable load distribution.

In order to terminate the operation of generating the pulse currents, the protection/automation unit 506 takes the STOP signal or a signal from the protective circuits to form the INV signal (which requires the rectifier 150 to work as an inverter). Then, after some time has elapsed (e.g., ten to fifteen milliseconds later), it turns off the voltage-controlled oscillator 507, terminates providing the SWITCH-ON signal, and sends the control pulse blocking command to the pulse-phase control system 502. These actions reliably discharge the energy accumulated in the current source 250. In case of a usual switching off via sending the STOP signal, the current source 250 might be switched on immediately. On the other hand, in case the protective circuits have been involved during the switching off, a user must issue RESET command prior to the switching on, upon receiving a signal from the protection/automation unit 506, which confirms that the current limit is not exceeded and the current source 250 is completely discharged.

According to this configuration, the high-frequency pulse oscillator 100, which has a single switching block with the particular elements described above, can provide pulse currents for energizing the load, the parameters of which are as follows:

Current strength: up to 20 kA,
Voltage: up to 100V
Duration: 80–200 μms
Pulse frequency: 0–1000 Hz These parameters may be varied in accordance with the modifications to the elements of the present invention. The high-frequency pulse oscillator of the present invention can directly supply the pulse currents, which have such parameters, to metallic materials to be processed in devices such as rolling mills. As such, the temperature of the materials is not excessively increased due to the continuous supply of energy. Thus, no cooling device is required and electric corrosion of working rolls may be avoided. Meanwhile, the generated pulse currents may be also utilized for closing microcracks formed in metallic parts in order to recover mechanical characteristics thereof.

While the present invention has been described above in conjunction with specific preferred embodiments, it is evident that numerous alternatives, modifications and variations will be apparent to those skilled in the art without departing from the scope of the present invention. Thus, the breadth and scope of the present invention should not be limited by any of the above-described exemplary embodiments, but should be defined only in accordance with the following claims and their equivalents.

What is claimed is:

1. A high-frequency pulse oscillator, comprising:
   a controllable rectifier for rectifying alternating currents supplied from a current source to output currents having a predetermined waveform;
   a switching section comprising at least one switching block and generating pulse currents having desired amplitude and frequency from said currents having the predetermined waveform, wherein said at least one switching block is connected so that the amplitude of said pulse currents is increased; and
   a control system for generating first and second control pulses, wherein said first control pulse is supplied to said controllable rectifier to control rectifying said alternating currents, and wherein said second control pulse is supplied to said at least one switching block to control said currents having the predetermined waveform to be transformed into said pulse currents having the desired amplitude and frequency, wherein said control system comprises:
   a pulse-phase control system for generating said first control pulse:
   a voltage-controlled oscillator for generating said second control pulse;
   a protection/automation unit for controlling said pulse-phase control system and said voltage-controlled oscillator according to START, STOP and RESET signals to start, stop and reset the operation of generating said pulse currents; and
   a power supply/synchronization unit for providing a stable voltage source using said alternating currents supplied from said current source and generating signals to synchronize said pulse-phase control system.

2. The high-frequency pulse oscillator of claim 1, wherein said switching section comprises:
   a current sensor for measuring currents in the load to which said pulse currents are supplied;
   a pulse transformer for causing said pulse currents to have the desired amplitude; and
   a switching thyristor for causing said pulse currents to have the desired frequency, and wherein
   said control system receives the measurements of the currents in said load from said current sensor.

3. The high-frequency pulse oscillator of claim 1, wherein said control system further comprises:
   remote and local control panels for generating signals to start, stop and reset the operation of generating said pulse currents and signals to specify or change the frequency and amplitude of said pulse currents; and
   a selector for selectively receiving said signals from either said remote or local control panel according to LOCAL/REMOTE signal from said local control panel.

4. The high-frequency pulse oscillator of claim 1, wherein:
   when receiving said START signal, said protection/automation unit generates SWITCH-ON signal for said voltage-controlled oscillator and instructs said pulse-phase control system to release blocking of said first control pulse;
   when receiving said STOP signal or realizing an excess of current limits of said high-frequency pulse oscillator, said protection/automation unit stops supplying said SWITCH-ON signal to said voltage-controlled oscillator and instructs said pulse-phase control system to block said first control pulse and invert said controllable rectifier; and
   when receiving said RESET signal, said protection/automation unit approves the generation of said SWITCH-ON signal only after confirming that said current limit is not exceeded and said current source is completely discharged.

5. The high-frequency pulse oscillator of claim 1, wherein said control system further comprises:
   a pulse shaper for the switching section for shaping said second control pulse; and
   a pulse shaper for the rectifier for shaping said first control pulse.

6. The high-frequency pulse oscillator of claim 2, wherein:
   said switching section further comprises a discharging diode; a smoothing reactor; a first switching reactor; an output diode; and a capacitor;
   a second input of a primary winding of said pulse transformer is connected to a second pole of said capacitor; a first output of a secondary winding of said pulse transformer is connected via said output diode to a first output contact for the connection to said load; and a second output of the secondary winding is connected via a primary winding of said current sensor to a second output contact for the connection to said load;
   an output of said discharge diode is connected via said first switching reactor to said switching thyristor and a first input of the primary winding of said pulse transformer; and a first output terminal of said controllable rectifier is connected via said smoothing reactor to a first pole of said capacitor and opposing inputs of said switching thyristor and said discharging diode; and a second output terminal of said controllable rectifier is connected to the second pole of said capacitor bank and the second input of the primary winding of said pulse transformer.

7. The high-frequency pulse transformer of claim 6, wherein said switching section further comprises a second switching reactor connected to a first input of the primary winding of said current sensor and an anode of said output diode in parallel with the secondary winding of said pulse transformer.

8. The high-frequency pulse transformer of claim 1, wherein said controllable rectifier is a controllable three-phase rectifier comprising a thyristor, and wherein said first control pulse is applied to a control electrode of said thyristor.

9. The high-frequency pulse transformer of claim 6, wherein:
    said switching section comprises n identical switching blocks;
    the first and second output terminals of said rectifier are connected in parallel with the input of the smoothing reactor and with the second pole of the capacitor in each of said switching blocks, respectively; and
    the output terminal of the output diode and the output terminals of the primary winding of the current sensor in each of said switching blocks are connected in parallel with said first and second output contacts, respectively.

10. The high-frequency pulse oscillator of claim 6, wherein: said switching section comprises n identical switching blocks;
    a first output terminal of the pulse transformer in the $n^{th}$ switching block is connected via said output diode to said first output contact;
    a second output terminal of the pulse transformer in the first switching block is connected via the primary winding of said current sensor to said second output contact; and
    first output terminals of the pulse transformers in the $1^{st}$ to the $n-1^{th}$ switching blocks are connected to second output terminals of the pulse transformers in the $2^{nd}$ to the $n^{th}$ switching blocks, respectively.

* * * * *